US011808826B2

(12) United States Patent
Franzi et al.

(10) Patent No.: US 11,808,826 B2
(45) Date of Patent: Nov. 7, 2023

(54) MAGNETOMETER CALIBRATION OR SETTING

(71) Applicant: Tissot SA, Le Locle (CH)

(72) Inventors: Edoardo Franzi, Cheseaux-Noreaz (CH); Andrea Dunbar, St-Blaise (CH); Engin Türetken, Ecublens (CH); Virginie Moser, Diesse (CH); Patrick Stadelmann, Boudry (CH); Lingchuan Zhou, Marin-Epagnier (CH)

(73) Assignee: Tissot SA, Le Locle (CH)

( * ) Notice: Subject to any disclaimer, the term of this patent is extended or adjusted under 35 U.S.C. 154(b) by 174 days.

(21) Appl. No.: 17/274,339

(22) PCT Filed: Aug. 29, 2019

(86) PCT No.: PCT/EP2019/073111
§ 371 (c)(1),
(2) Date: Mar. 8, 2021

(87) PCT Pub. No.: WO2020/052988
PCT Pub. Date: Mar. 19, 2020

(65) Prior Publication Data
US 2021/0341553 A1   Nov. 4, 2021

(30) Foreign Application Priority Data

Sep. 10, 2018   (EP) .................................... 18193525

(51) Int. Cl.
*G01R 33/02* (2006.01)
*G01P 15/08* (2006.01)
(Continued)

(52) U.S. Cl.
CPC ............. *G01R 33/02* (2013.01); *G01C 19/00* (2013.01); *G01P 15/08* (2013.01); *G01R 35/005* (2013.01); *G01S 19/01* (2013.01); *G06N 5/046* (2013.01)

(58) Field of Classification Search
None
See application file for complete search history.

(56) References Cited

U.S. PATENT DOCUMENTS

| 2004/0123474 A1 | 7/2004 | Manfred et al. |
| 2005/0138825 A1 | 6/2005 | Manfred |

(Continued)

FOREIGN PATENT DOCUMENTS

| CN | 104718561 A | 6/2015 |
| CN | 105509745 A | 4/2016 |

(Continued)

OTHER PUBLICATIONS

English Translation of JP 2013210866 to Kimijima (Year: 2013).*
(Continued)

*Primary Examiner* — Douglas X Rodriguez
(74) *Attorney, Agent, or Firm* — Oblon, McClelland, Maier & Neustadt, L.L.P.

(57) ABSTRACT

An aspect of the invention relates to a method for correcting magnetometric measurements (10) made by a magnetometer mounted on a mobile support. The mobile support carries one or more movement and/or position sensors fixedly mounted with respect to the magnetometer. The method comprises:
obtaining magnetometric measurements (12) and movement and/or position measurements (14, 16) made simultaneously by the magnetometers, respectively the movement and/or position sensors during a time interval;
inferring, by a processing unit, corrected magnetometric measurements (28) on the basis of the magnetometric
(Continued)

measurements (12) and the movement and/or position measurements (14, 16) made simultaneously during the time interval and in which method the processing unit (36) comprises one or more microprocessors and is capable of inferring the corrected magnetometric measurements (28) via an artificial intelligence algorithm (24), said algorithm being trained by means of training data, to find a correction for the magnetometric measurements according to the log of magnetometric measurements as well as movement and/or position measurements recorded during the time interval.

17 Claims, 2 Drawing Sheets

(51) Int. Cl.
*G01R 35/00* (2006.01)
*G01S 19/01* (2010.01)
*G06N 5/046* (2023.01)
*G01C 19/00* (2013.01)

(56) References Cited

U.S. PATENT DOCUMENTS

| | | |
|---|---|---|
| 2013/0332098 A1 | 12/2013 | Funk et al. |
| 2015/0233714 A1 | 8/2015 | Kim |
| 2016/0202359 A1 | 7/2016 | Kana et al. |
| 2017/0307403 A1 | 10/2017 | Funk et al. |
| 2017/0307404 A1 | 10/2017 | Funk et al. |
| 2020/0103477 A1* | 4/2020 | Berkovich ......... G01R 33/0035 |

FOREIGN PATENT DOCUMENTS

| | | | |
|---|---|---|---|
| CN | 106289243 A | | 1/2017 |
| CN | 107907900 A | | 4/2018 |
| JP | 2013-210866 A | | 10/2013 |
| JP | 2013210866 A | * | 10/2013 |
| JP | 2014-219340 A | | 11/2014 |
| WO | WO 2018/056391 A1 | | 3/2018 |
| WO | WO-2018056391 A1 | * | 3/2018 ............. G01C 17/30 |

OTHER PUBLICATIONS

English Translation of WO 2018/056391 to Hasegawa (Year: 2018).*
International Search Report dated Nov. 27, 20119 in PCT/EP2019/073111 filed Aug. 29, 2019, 3 pages.
"Artificial Intelligence", Wikipedia, XP-002788719, 2018, pp. 1-37.
"Machine learning", Wikipedia, XP002795351, 2018, pp. 1-16.
Combined Chinese Office Action and Search Report dated Apr. 25, 2022 in Chinese Patent Application No. 201980059006.7 (with English translation of Category of Cited Documents), 9 pages.
Japanese Office Action dated Jun. 7, 2020 in Japanese Patent Application No. 2021-537486 (with English translation), 5 pages.
Office Action dated Aug. 1, 2023, in corresponding Japanese Patent Application No. 2021-537486, with English translation, citing document 15 herein, 5 pages.
Office Action dated Aug. 8, 2023, in corresponding Japanese Patent Application No. 2021-537486, with English translation, 2 pages.

* cited by examiner

MAGNETOMETER CALIBRATION OR SETTING

TECHNICAL FIELD AND PRIOR ART

The invention relates generally to a method for calibrating and/or setting one or more magnetometers. The invention is more specifically intended to correct magnetometric measurements made by one or more magnetometers on a mobile support further including one or more movement and/or position sensors.

Nowadays, most multifunctional mobiles (smartphones) include a multitude of different sensors, e.g. a GNSS receiver (receiver of radionavigation signals transmitted by GNSS, i.e. by a satellite positioning system—where GNSS is the acronym of "Global Navigation Satellite System"), accelerometers, gyrometers, a magnetometer, etc. To determine the orientation of the multifunctional mobile in the terrestrial reference frame, the magnetometer is, for many applications, essential. This is particularly the case in a navigation application: an individual GNSS receiver is capable of determining the position and speed of the antenna centre thereof. On the other hand, the orientation of the GNSS receiver in the terrestrial reference frame is difficult and requires, at least, knowledge of the initial orientation. Therefore, most navigation applications use the magnetometer when it is necessary to determine the orientation of the mobile with respect to the map.

The measurements of the magnetometer can serve to indicate the direction of the magnetic North, or, after correction for the magnetic declination, the direction of the geographic North. The measurement error can however attain several degrees, which means that the measurements of the magnetometer cannot be used for precision applications. It will be noted in particular that this measurement error can result from magnetic interferences present in external and/or internal environments which are much greater than the terrestrial magnetic field and which can thus distort measurement estimations considerably, inducing tens of degrees of errors for example.

This problem particularly affects low-cost magnetometers, which are the most common in all sorts of mobile terminals. A further source of errors is due to the fact that the magnetic field at the position of the mobile terminal has other contributions than the terrestrial magnetic field (which is relatively weak): local disturbances (magnets, metallic masses, electromagnetic sources) can easily distort the measurements of the magnetometer.

The aim of the present invention is that of remedying this problem in particular, but without being limited thereto, in the case of mobile terminals (e.g. multifunctional mobiles, tablets, connected watches, GNSS/GPS receivers, etc.).

DESCRIPTION OF THE INVENTION

A first aspect of the invention relates to a method for correcting magnetometric measurements made by a magnetometer mounted on a mobile support. The mobile support carries, besides the magnetometer, one or more movement and/or position sensors fixedly mounted with respect to the magnetometer. The method comprises:
obtaining magnetometric measurements and movement and/or position measurements made simultaneously by the magnetometers, respectively the movement and/or position sensors during a time interval;
inferring, by a processing unit (e.g. a microprocessor, a set of microprocessors, a programmable logic circuit, an application-specific integrated circuit, etc.), corrected magnetometric measurements on the basis of the magnetometric measurements and the movement and/or position measurements made simultaneously during said time interval and in which method the processing unit (36) comprises one or more microprocessors and is capable of inferring the corrected magnetometric measurements (28) via an artificial intelligence algorithm (24), said algorithm being trained by means of training data, to find a correction for the magnetometric measurements according to the log of magnetometric measurements as well as movement and/or position measurements recorded during the time interval.

It should be noted that the term magnetometer can, in the context of this document, denote an elementary magnetometer (capable of measuring the magnetic field along an axis) and a magnetometer with multiple (e.g. two or three) axes comprising several elementary magnetometers.

On one hand, the magnetometric measurements made by the magnetometer during the time interval indicate the progression of the direction and/or the magnitude of the external magnetic field in the reference frame of the mobile support during the orientation and therefore also the progression of the orientation of the mobile support with respect to the external magnetic field.

On the other, the movement and/or position measurements made by the movement and/or position sensors indicate the movements of the mobile support during the same time interval.

The inference of the corrected magnetometric measurements can therefore be based on the agreements and divergences between, on one hand, the progression of the orientation of the mobile support with respect to the external magnetic field and, on the other, the movements of the mobile support of the translation movements of the mobile support over time. They can consist of translation movements made in several directions.

If the terrestrial magnetic field was locally uniform, agreement between the progression of the orientation of the mobile support with respect to the external magnetic field and the movements of the mobile support should be observed (in the absence of measurement errors and while the mobile support remains in the local zone). In fact, this agreement will not be perfect, due to the measurement errors (particularly due to the drift/movement/translation movement of the sensors) and due to the disturbances of the terrestrial magnetic field. Intuitively, the divergences observed for a time interval during which the mobile support was in motion make it possible to detect and quantify local disturbances of the magnetic field. Then, the measurements of the magnetometer can be corrected so as to eliminate these disturbances. Under certain conditions, it will also be possible to (re)calibrate the magnetometer: if the displacement of mobile support in a terrestrial reference frame (e.g. WGS 84) and the inherent movements of the mobile support during the displacement are known, with sufficient precision, it is possible to infer the theoretical values of the magnetic field vector and compare them to the values measured.

Preferably, the mobile support comprises one or more accelerometers which make movement and/or position measurements.

Alternatively, or additionally, the mobile support is equipped with one or more gyrometers which make movement and/or position measurements.

Particularly preferably, the mobile support would comprise an inertia measurement unit (IMU) integrating one or more accelerometers and one or more gyrometers and which would make the movement and/or position measurements.

Preferably, the movement sensor(s) are embodied as microelectromechanical systems (MEMS).

According to a particularly advantageous embodiment of the invention, the mobile support is provided with one or more position sensors, preferably one or more GNSS/GPS receivers which make movement and/or position measurements.

If the mobile support is equipped with several sensors, e.g. with an inertia measurement unit and a GNSS/GPS receiver, the movement and/or position measurements can be hybridised with one another (e.g. by means of an adaptive filter or a Kalman filter) in a pre-processing step before the step of inferring the corrected magnetometric measurements.

Preferably, the inference of the corrected magnetometric measurements is carried out on the fly. The time interval corresponds, preferably, to a defined time interval preceding the time of determination of the corrected values. The time interval can be fixed with respect to the determination time. It is however possible to configure the possibility of dynamically adapting the parameters of the time interval (start and duration). The time interval has, preferably, a duration of 30 s or more, e.g. 1 minute or more, 2 minutes or more, 3 minutes or more, 4 minutes or more or 5 minutes or more. The maximum duration of the interval could be within the range of 10 to 15 minutes.

According to a preferred embodiment of the invention, the mobile support comprises a mobile terminal, e.g. a mobile phone or a connected watch.

Preferably, the processing unit comprises one or more microprocessors executing a program dedicated to inferring the corrected magnetometric measurements. The step of inferring the corrected magnetometric measurements could use a Kalman filter or an adaptive filter. More preferably, an artificial intelligence algorithm would however be used. In this context, "artificial intelligence algorithm" denotes an algorithm used by a computer which has been trained (by supervised learning or not) by means of training data, to find a correction for the magnetometric measurements according to the log of magnetometric measurements as well as movement and/or position measurements recorded during the time interval. The artificial intelligence algorithm can comprise, e.g. a Bayesian network, a neural network, a support vector machine, the k-nearest neighbours method, a genetic algorithm, a decision tree, a decision tree forest, a Gaussian mixture model, logistic regression, linear discriminant analysis, or a combination thereof.

It has been explained above that it is possible to correct the magnetometric measurements because they must reflect approximately the same movements as the movement and/or position measurements. In practice, it is very difficult to establish correction rules which are valid in all circumstances. For this reason, using an artificial intelligence algorithm is considered to be advantageous within the scope of the invention.

According to a particularly preferred embodiment, the method would comprise the transmission of magnetometric measurements and of movement and/or position measurements made simultaneously (or of quantities inferred therefrom) to a cloud computing platform and the reception of update settings of the software executed by the processing unit for the corrected magnetometric measurements. The cloud computing platform would in this case be tasked with collecting the data from a large number of users and "digesting" it to enhance the correction algorithm. This interactive aspect would be particularly useful in the context of an artificial intelligence algorithm.

A second aspect of the invention relates to a mobile terminal, e.g. a connected watch or a mobile phone, comprising a magnetometer, one or more movement and/or position sensors fixedly mounted with respect to the magnetometer, and a processing unit connected to the magnetometer and to the movement and/or positive sensor(s) to obtain magnetometric measurements and movement and/or position measurements made simultaneously by the magnetometers, respectively the movement and/or position sensor(s) during a time interval. The processing unit is configured, by means of a computer program, to infer corrected magnetometric measurements on the basis of the magnetometric measurements and the movement and/or position measurements made simultaneously during the time interval.

A further aspect of the invention relates to a computer program comprising program code instructions for executing the steps of this method when said program is executed by a processing unit of the mobile terminal.

BRIEF DESCRIPTION OF THE FIGURES

Further specificities and features of the invention will emerge from the detailed description of certain advantageous embodiments presented hereinafter, by way of illustration, with reference to the appended drawings which show.

DESCRIPTION OF AN EMBODIMENT OF THE INVENTION

Figure 1:
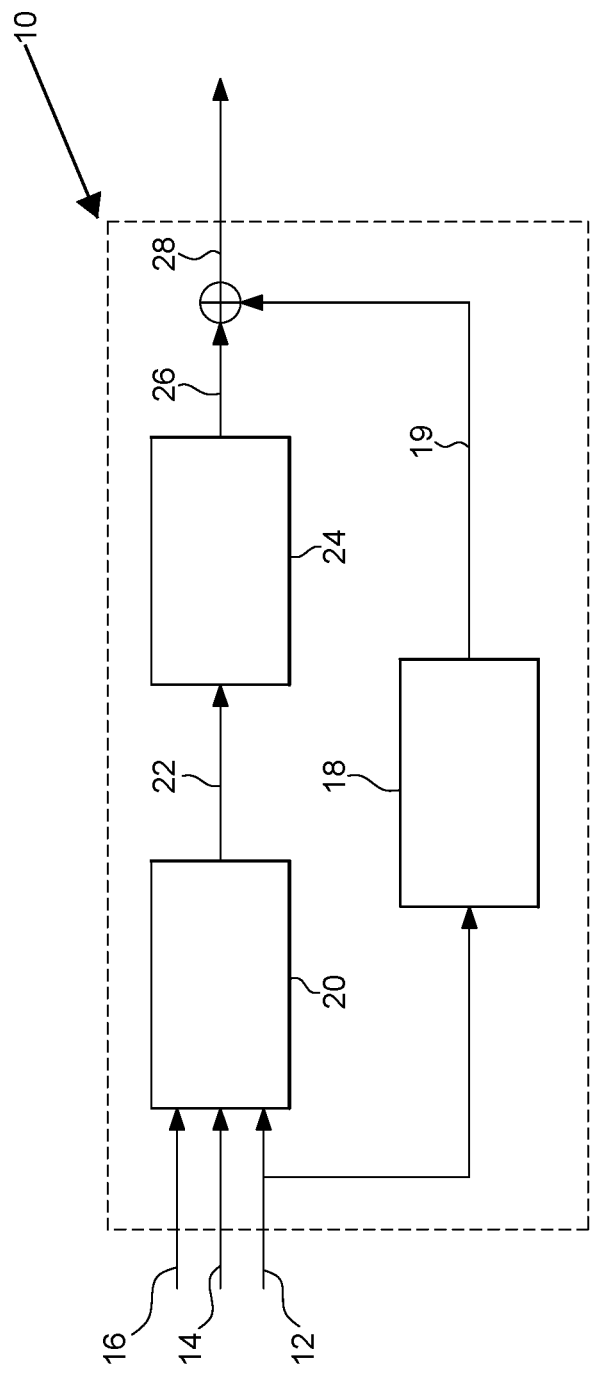
FIG. 1: the diagram of a method for correcting magnetometric measurements according to an advantageous embodiment of the invention.

FIG. 1 schematically shows a method for correcting magnetometric measurements 10 that can be implemented by a processing unit of a mobile terminal. The processing unit (which can comprise one or more microprocessors or circuits dedicated to the application) receives as an input
- the measurements of a magnetometer 12 (i.e. the components of the vector of the magnetic field in the reference frame of the mobile terminal),
- the measurements of an inertia measurement unit 14 (i.e. accelerations and angular velocities), and
- the measurements of a GNSS/GPS receiver 16 (i.e. positions, speeds and times in the reference frame of the GNSS/GPS in question).

The processing unit 10 processes the measurements 12 conventionally (e.g. filtering, smoothing, conversion into spherical or polar data, etc.) to produce a North indication 19, normally expressed in the form of an angle with respect to an axis of the mobile terminal. This conventional processing is schematically represented by the functional unit 18. If the North indication relates to the geographic North, the conventional processing accounts for the magnetic declination valid at the location of the mobile terminal.

The measurements 12, 14 and 16 are injected in a process implementing an artificial intelligence algorithm. The measurements 12, 14 and 16 supplied by the sensors are firstly submitted for pre-processing 20 (comprising for example filtering, smoothing, conversions, etc.) to be converted into a feature vector. The feature vector 20 serves as input data in a process which implements the artificial intelligence algorithm 24 per se. The algorithm has been previously trained, by means of training data, to find a correction 26 for the North indication 19. At each time interval, the algorithm produces the most likely correction 26 according to the feature vectors (and therefore the measurements 12, 14 and 16) recorded during a defined time interval. The corrected North indication 28 is obtained by adding the correction 26 to the North indication produced by the functional unit 18.

It should be noted that the pre-processing of the measurements 12, 14 and 16 is optional. It would indeed to be possible to inject the raw measurements into the artificial intelligence unit (provided that the latter has been previously trained with raw measurements).

Figure 2:
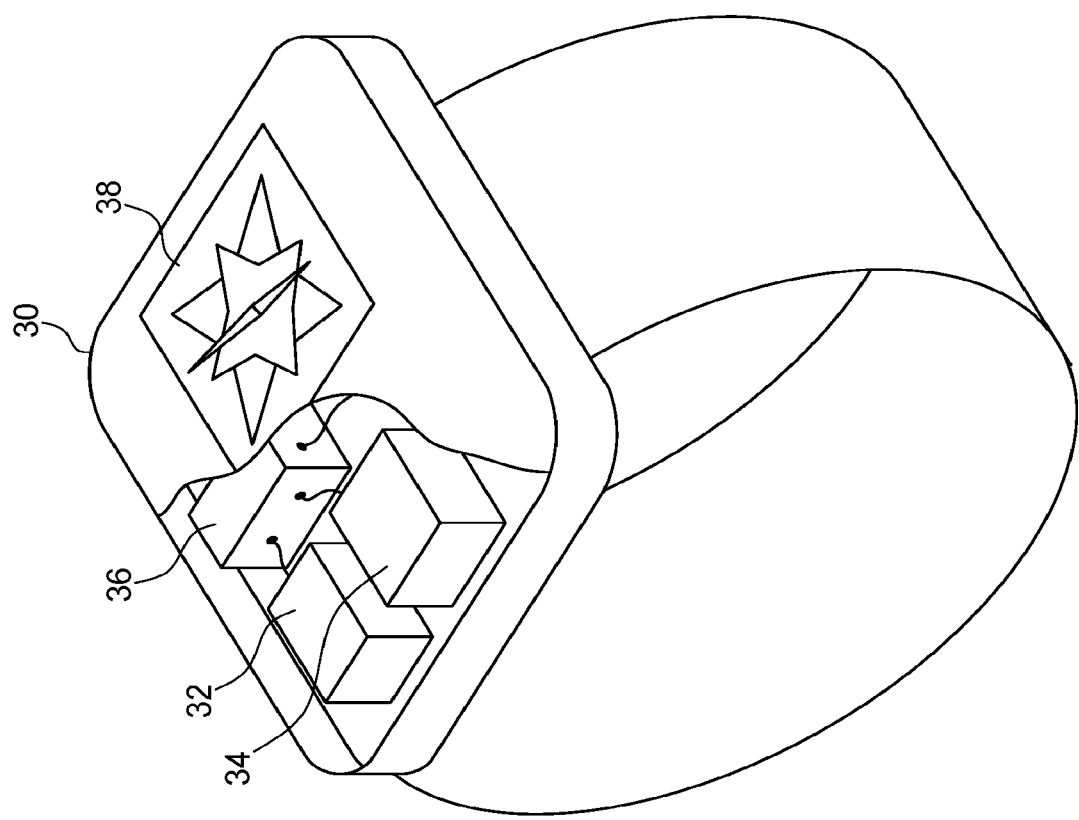
FIG. 2: a schematic illustration of a connected watch to implement the method according to the invention.

FIG. 2 is a schematic illustration of a connected watch 30 equipped with a magnetometer 32, a MEMS inertia measurement unit 34 and a microprocessor 36 configured to implement a method for correcting magnetometric measurements according to the invention. The microprocessor 36 infers the corrected magnetometric measurements from the raw magnetometric measurements supplied by the magnetometer 32 and from the movement (more specifically: acceleration and angular velocity) supplied by the inertia measurement unit 34. The corrected magnetometric measurements are made available to the mobile applications installed on the connected watch, e.g. a compass application 38.

The invention also relates to a computer program comprising program code instructions for executing the steps of this method when said program is executed by the processing unit 36 of the mobile terminal.

While some specific embodiments have been described in detail, a person skilled in the art will appreciate that various modifications and alternatives thereto can be developed in the light of the overall teaching provided by the present disclosure of the invention. Hence, the specific arrangements and/or methods described herein are intended to be given merely by way of illustration, without intending to limit the scope of the invention.

The invention claimed is:

1. A method for correcting magnetometric measurements made by a magnetometer mounted on a mobile support, the mobile support carrying, in addition to the magnetometer, one or more movement and/or position sensors fixedly mounted with respect to the magnetometer, the method comprising:
   obtaining magnetometric measurements and movement and/or position measurements made simultaneously by the magnetometer and the one or more movement and/or position sensors, respectively, during a time interval;
   determining a direction from the obtained magnetometric measurements;
   calculating, by processing circuitry, a correction amount based on the magnetometric measurements and the movement and/or position measurements made simultaneously during said time interval, wherein the calculating step further comprises calculating the correction amount via an artificial intelligence algorithm, said algorithm being trained, using training data, to determine the correction amount from inputs of a log of magnetometric measurements and the movement and/or position measurements obtained during the time interval; and
   determining a corrected direction by adding the calculated correction amount to the determined direction.

2. The method for correcting magnetometric measurements according to claim 1, wherein the magnetometric measurements made by the magnetometer during said time interval indicate a progression of an orientation of the mobile support with respect to an external magnetic field.

3. The method for correcting magnetometric measurements according to claim 1, wherein the movement and/or position measurements made by the one or more movement and/or position sensors during said time interval indicate movements of the mobile support during said time interval.

4. The method for correcting magnetometric measurements according to claim 1, wherein the calculating the correction amount further comprises calculating the correction amount based on agreements and divergences between a progression of an orientation of the mobile support with respect to an external magnetic field and movements of the mobile support.

5. The method for correcting magnetometric measurements according to claim 1, wherein the movement and/or position measurements comprise measurements made by one or more accelerometers.

6. The method for correcting magnetometric measurements according to claim 1, wherein the movement and/or position measurements comprise measurements made by one or more gyrometers.

7. The method for correcting magnetometric measurements according to claim 1, wherein the movement and/or position measurements comprise measurements made by an inertia measurement unit comprising one or more accelerometers and one or more gyrometers.

8. The method for correcting magnetometric measurements according to claim 1, wherein the movement and/or position measurements comprise measurements made by one or more GNSS receivers.

9. The method for correcting magnetometric measurements according to claim 1, wherein the movement and/or position measurements are obtained from several sensors and are hybridized with one another before the determining of the corrected magnetometric measurements.

10. The method for correcting magnetometric measurements according to claim 1, wherein the calculating of the correction amount is performed in real time.

11. The method for correcting magnetometric measurements according to claim 1, wherein the mobile support comprises a mobile terminal.

12. The method for correcting magnetometric measurements according to claim 1, wherein the mobile support comprises a connected watch.

13. The method for correcting magnetometric measurements according to claim 1, wherein the artificial intelligence algorithm uses at least one of the following algorithms: a Bayesian network, a neural network, a support vector machine, a k-nearest neighbors method, a genetic algorithm, a decision tree, a decision tree forest, a Gaussian mixture model, logistic regression, and linear discriminant analysis.

14. The method for correcting magnetometric measurements according to claim 1, further comprising transmitting the magnetometric measurements and the movement and/or position measurements made simultaneously, or quantities determined therefrom, to a cloud computing platform, and receiving update settings of software executed by the processing circuitry for determining the corrected direction.

15. A non-transitory computer program comprising program code instructions for executing the steps of the method according to claim 1 when said program is executed by the processing circuitry.

16. A mobile terminal, comprising:
a magnetometer,
one or more movement and/or position sensors fixedly mounted with respect to the magnetometer, and
processing circuitry connected to the magnetometer and to the one or more movement and/or position sensors and configured to obtain magnetometric measurements and movement and/or position measurements made simultaneously by the magnetometer, and the movement and/or position sensors, respectively, during a time interval, wherein the processing circuitry is further configured to
determine a direction from the obtained magnometric measurements,
calculate a correction amount, using a trained machine learning model, based on inputs of the magnetometric measurements and the movement and/or position measurements made simultaneously during said time interval, and
determine a corrected direction by adding the calculated correction amount to the determined direction.

17. The mobile terminal, according to claim 16, wherein the mobile terminal is a connected watch.

\* \* \* \* \*